(12) United States Patent
Nagaraj et al.

(10) Patent No.: US 11,181,000 B2
(45) Date of Patent: Nov. 23, 2021

(54) AIRFOIL WITH IMPROVED COATING SYSTEM AND METHODS OF FORMING THE SAME

(71) Applicant: General Electric Company, Schenectady, NY (US)

(72) Inventors: Bangalore Aswatha Nagaraj, West Chester, OH (US); Michael David Clark, Liberty Township, OH (US); Susan Lee Sheets, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 16/220,872

(22) Filed: Dec. 14, 2018

(65) Prior Publication Data

US 2020/0024976 A1    Jan. 23, 2020

Related U.S. Application Data

(62) Division of application No. 15/171,389, filed on Jun. 2, 2016.

(51) Int. Cl.
*C23C 10/02* (2006.01)
*C23C 10/28* (2006.01)
(Continued)

(52) U.S. Cl.
CPC ............ *F01D 5/288* (2013.01); *B32B 15/017* (2013.01); *C22C 5/04* (2013.01); *C22C 19/058* (2013.01);
(Continued)

(58) Field of Classification Search
CPC . C23C 16/50–517; C23C 10/02; C23C 10/28; C23C 10/48; C23C 10/60;
(Continued)

(56) References Cited

U.S. PATENT DOCUMENTS 3,961,098 A * 6/1976 Bessen ...................... C23C 4/18
427/456
4,687,678 A * 8/1987 Lindblom ................ C23C 4/06
427/453
(Continued)

FOREIGN PATENT DOCUMENTS

CA         2999636 C      12/2019
EP       0 587 341 A1      3/1994
(Continued)

OTHER PUBLICATIONS

International Search Report and Written Opinion issued in connection with corresponding PCT Application No. PCT/US2017/033212 dated Feb. 15, 2018.
(Continued)

*Primary Examiner* — Dah-Wei D. Yuan
*Assistant Examiner* — Kristen A Dagenais-Englehart
(74) *Attorney, Agent, or Firm* — Dority & Manning, P.A.

(57) ABSTRACT

A coating system for a surface of a superalloy component is provided. The coating system includes a MCrAlY coating on the surface of the superalloy component, where M is Ni, Fe, Co, or a combination thereof. The MCrAlY coating generally has a higher chromium content than the superalloy component. The MCrAlY coating also includes a platinum-group metal aluminide diffusion layer. The MCrAlY coating includes Re, Ta, or a mixture thereof. Methods are also provided for forming a coating system on a surface of a superalloy component.

11 Claims, 5 Drawing Sheets

(51) Int. Cl.
| | |
|---|---|
| C23C 10/48 | (2006.01) |
| C23C 10/60 | (2006.01) |
| C23C 28/02 | (2006.01) |
| C23C 28/00 | (2006.01) |
| C23C 14/16 | (2006.01) |
| C23C 14/32 | (2006.01) |
| F01D 5/28 | (2006.01) |
| C25D 7/00 | (2006.01) |
| C25D 5/50 | (2006.01) |
| B32B 15/01 | (2006.01) |
| C22C 5/04 | (2006.01) |
| C22C 19/05 | (2006.01) |
| C22F 1/10 | (2006.01) |
| C22F 1/14 | (2006.01) |
| C25D 3/50 | (2006.01) |
| C23C 14/30 | (2006.01) |

(52) U.S. Cl.
CPC ............... *C22F 1/10* (2013.01); *C22F 1/14* (2013.01); *C23C 10/02* (2013.01); *C23C 10/28* (2013.01); *C23C 10/48* (2013.01); *C23C 10/60* (2013.01); *C23C 14/16* (2013.01); *C23C 14/325* (2013.01); *C23C 28/022* (2013.01); *C23C 28/023* (2013.01); *C23C 28/028* (2013.01); *C23C 28/321* (2013.01); *C23C 28/325* (2013.01); *C23C 28/3215* (2013.01); *C23C 28/3455* (2013.01); *C25D 3/50* (2013.01); *C25D 5/50* (2013.01); *C25D 7/008* (2013.01); *C23C 14/30* (2013.01); *C23C 14/32* (2013.01); *F05D 2220/32* (2013.01); *F05D 2230/312* (2013.01); *F05D 2230/313* (2013.01); *F05D 2230/41* (2013.01); *F05D 2300/143* (2013.01); *F05D 2300/175* (2013.01); *F05D 2300/177* (2013.01); *F05D 2300/701* (2013.01); *Y10T 428/1275* (2015.01); *Y10T 428/12597* (2015.01); *Y10T 428/12604* (2015.01); *Y10T 428/12611* (2015.01); *Y10T 428/12618* (2015.01); *Y10T 428/12736* (2015.01); *Y10T 428/12743* (2015.01); *Y10T 428/12757* (2015.01); *Y10T 428/12764* (2015.01); *Y10T 428/12868* (2015.01); *Y10T 428/12875* (2015.01); *Y10T 428/12882* (2015.01); *Y10T 428/12889* (2015.01); *Y10T 428/12896* (2015.01); *Y10T 428/12931* (2015.01); *Y10T 428/12937* (2015.01); *Y10T 428/12944* (2015.01); *Y10T 428/12951* (2015.01); *Y10T 428/12958* (2015.01); *Y10T 428/12972* (2015.01); *Y10T 428/12979* (2015.01); *Y10T 428/12993* (2015.01); *Y10T 428/2495* (2015.01); *Y10T 428/24967* (2015.01); *Y10T 428/263* (2015.01); *Y10T 428/264* (2015.01); *Y10T 428/265* (2015.01)

(58) Field of Classification Search
CPC ... C23C 28/022; C23C 28/023; C23C 28/028; C23C 28/321; C23C 28/3215; C23C 28/325; C23C 28/3455; C23C 14/16; C23C 14/325; F01D 5/288; B32B 15/017; C22C 5/04; C22C 19/058; C22F 1/10; C22F 1/14; C25D 7/008; C25D 5/50; C25D 3/50; Y10T 428/263; Y10T 428/12597; Y10T 428/12743; Y10T 428/12604; Y10T 428/264; Y10T 428/12736; Y10T 428/265; Y10T 428/12611; Y10T 428/12958; Y10T 428/12972; Y10T 428/12979; Y10T 428/12951; Y10T 428/12618; Y10T 428/24967; Y10T 428/2495; Y10T 428/12993; Y10T 428/12944; Y10T 428/12868; Y10T 428/12889; Y10T 428/12764; Y10T 428/12896; Y10T 428/12875; Y10T 428/12931; Y10T 428/1275; Y10T 428/12937; Y10T 428/12757; Y10T 428/12882; F05D 2300/143; F05D 2220/32; F05D 2230/312; F05D 2300/175; F05D 2300/177; F05D 2300/701
USPC ................ 427/576, 564, 531, 528
See application file for complete search history.

(56) References Cited

U.S. PATENT DOCUMENTS

| | | | |
|---|---|---|---|
| 4,743,462 A | 5/1988 | Radzavich et al. | |
| 5,154,885 A | 10/1992 | Czech et al. | |
| 5,427,866 A | 6/1995 | Nagaraj et al. | |
| 5,455,119 A | 10/1995 | Taylor et al. | |
| 5,645,893 A | 7/1997 | Rickerby et al. | |
| 5,650,235 A * | 7/1997 | McMordie | C23C 10/26 428/610 |
| 5,716,720 A * | 2/1998 | Murphy | C23C 14/083 148/537 |
| 5,843,587 A | 12/1998 | Nakamori et al. | |
| 5,942,337 A | 8/1999 | Rickerby et al. | |
| 5,993,980 A | 11/1999 | Schmitz et al. | |
| 6,176,982 B1 | 1/2001 | Rickerby | |
| 6,210,488 B1 | 4/2001 | Bruce | |
| 6,228,510 B1 * | 5/2001 | Chen | C23C 10/02 428/615 |
| 6,306,524 B1 * | 10/2001 | Spitsberg | B32B 15/01 428/621 |
| 6,455,167 B1 * | 9/2002 | Rigney | C23C 28/00 416/241 R |
| 6,620,524 B2 | 9/2003 | Pfaendtner et al. | |
| 6,623,790 B2 | 9/2003 | Fernihough et al. | |
| 6,682,827 B2 | 1/2004 | Darolia et al. | |
| 7,208,232 B1 * | 4/2007 | Gorman | C23C 4/06 416/241 R |
| 7,601,431 B2 | 10/2009 | Pareek et al. | |
| 8,088,260 B2 | 1/2012 | Tryon et al. | |
| 9,034,479 B2 | 5/2015 | Nagaraj et al. | |
| 9,587,302 B2 * | 3/2017 | Tang | C23C 10/20 |
| 10,590,800 B2 * | 3/2020 | Zhang | C23F 4/04 |
| 2003/0152797 A1 * | 8/2003 | Darolia | C23C 28/3215 428/633 |
| 2006/0040128 A1 * | 2/2006 | Gorman | C23C 4/073 428/650 |
| 2007/0110900 A1 * | 5/2007 | Nowak | C23C 28/3215 427/307 |
| 2009/0162692 A1 * | 6/2009 | Nagaraj | C23C 28/3215 428/680 |
| 2010/0159277 A1 | 6/2010 | Bucci et al. | |
| 2013/0157078 A1 | 6/2013 | Onal et al. | |
| 2015/0034604 A1 | 2/2015 | Subramanian et al. | |
| 2017/0081977 A1 * | 3/2017 | Zhang | F01D 25/145 |
| 2018/0297156 A1 * | 10/2018 | Nagaraj | C23C 14/16 |

FOREIGN PATENT DOCUMENTS

| | | |
|---|---|---|
| EP | 0814178 A1 | 12/1997 |
| JP | S6220607 A | 1/1987 |
| JP | H07252674 A | 10/1995 |
| JP | H10121264 A | 5/1998 |

(56) References Cited

FOREIGN PATENT DOCUMENTS

JP        2007/138946 A     6/2007
JP        2014/198902 A     10/2014

OTHER PUBLICATIONS

Machine Translated Japanese Office Action Corresponding to Application No. 2018563049 dated Dec. 16, 2019.
Canadian Office Action Corresponding to Application No. 3026115 dated Jan. 16, 2020.
European Office Action Corresponding to Application No. 17822061 dated Apr. 15, 2020.

* cited by examiner

AIRFOIL WITH IMPROVED COATING SYSTEM AND METHODS OF FORMING THE SAME

CROSS-REFERENCE TO RELATED APPLICATION

This application is a division of U.S. application Ser. No. 15/171,389, filed on Jun. 2, 2016, titled "AIRFOIL WITH IMPROVED COATING SYSTEM AND METHODS OF FORMING THE SAME", which is hereby expressly incorporated herein by reference in its entirety.

FIELD OF THE INVENTION

The present invention generally relates to protective coatings on components, and, more particularly, to MCrAlY and platinum-group metal aluminide coatings on gas turbine components having airfoils.

BACKGROUND OF THE INVENTION

In gas turbine engines, air is drawn into the front of the engine, compressed by a shaft-mounted compressor, and mixed with fuel. The mixture is combusted, and the resulting hot combustion gases are passed through a turbine mounted on the same shaft. The flow of gas turns the turbine by contacting an airfoil portion of the turbine blade, which turns the shaft and provides power to the compressor. The hotter the turbine gases, the more efficient the operation of the engine. Thus, there is an incentive to raise the turbine operating temperature. However, the maximum temperature of the turbine gases is normally limited by the materials used to fabricate the turbine vanes and turbine blades of the turbine.

A protective layer is applied to the airfoil of the turbine blade or turbine vane component, which acts as a substrate. Among the currently known diffusional protective layers are aluminide and platinum aluminide layers. The protective layer protects the substrate against environmental damage from the hot, highly corrosive combustion gases. This protective layer, with no overlying ceramic layer, is useful in intermediate-temperature applications. For higher temperature applications, a ceramic thermal barrier coating layer may be applied overlying the protective layer, to form a thermal barrier coating (TBC) system. The ceramic thermal barrier coating layer insulates the component from the exhaust gas, permitting the exhaust gas to be hotter than would otherwise be possible with the particular material and fabrication process of the substrate.

Even with the use of these protective techniques, there remain problems to overcome in certain operating service conditions, particularly within marine turbine engines that are exposed to harsh conditions related to the salinity of the operating environments.

BRIEF DESCRIPTION OF THE INVENTION

Objects and advantages of the invention will be set forth in part in the following description, or may be obvious from the description, or may be learned through practice of the invention.

A coating system is generally provided for a surface of a superalloy component. In one embodiment, the coating system includes a MCrAlY coating on the surface of the superalloy component, where M is Ni, Fe, Co, or a combination thereof. The MCrAlY coating generally has a higher chromium content than the superalloy component. The MCrAlY coating also includes a platinum-group metal aluminide diffusion layer. In one particular embodiment, the MCrAlY coating includes Re, Ta, or a mixture thereof.

Methods are also generally provided for forming a coating system on a surface of a superalloy component. In one embodiment, the method includes forming a MCrAlY layer on the surface of the superalloy component where the MCrAlY layer have a chromium content that is higher than the superalloy component and where M is Ni, Fe, Co, or a combination thereof; forming a platinum-group metal layer on the MCrAlY layer; heating the platinum-group metal layer to a treatment temperature of about 900° C. to about 1200° C.; and forming an aluminide coating over platinum-group metal layer.

Other features and aspects of the present invention are discussed in greater detail below.

BRIEF DESCRIPTION OF THE DRAWINGS

The invention may be best understood by reference to the following description taken in conjunction with the accompanying drawing figures in which.

Repeat use of reference characters in the present specification and drawings is intended to represent the same or analogous features or elements of the present invention.

DETAILED DESCRIPTION OF THE INVENTION

Reference now will be made to the embodiments of the invention, one or more examples of which are set forth below. Each example is provided by way of an explanation of the invention, not as a limitation of the invention. In fact, it will be apparent to those skilled in the art that various modifications and variations can be made in the invention without departing from the scope or spirit of the invention. For instance, features illustrated or described as one embodiment can be used on another embodiment to yield still a further embodiment. Thus, it is intended that the present invention cover such modifications and variations as come within the scope of the appended claims and their equivalents. It is to be understood by one of ordinary skill in the art that the present discussion is a description of exemplary embodiments only, and is not intended as limiting the broader aspects of the present invention, which broader aspects are embodied exemplary constructions.

A coating system is generally provided for hot gas path components (e.g., airfoils) of turbine engines, along with methods of its formation. In particular, the coating system is useful on a superalloy component of a marine turbine engine, which is exposed to particularly corrosive operating environments. The coating system has a multiple layer construction chemistry, which includes at least a MCrAlY coating where M is Ni, Fe, Co, or a combination thereof. The MCrAlY coating is, in one particular embodiment, formed from a MCrAlY layer and a platinum-group metal aluminide coating through a diffusion coating process. The MCrAlY layer has a chromium content that is higher than the superalloy component, both in its deposition composition and its composition following treatment. Additionally, in most embodiments, the MCrAlY layer includes strengthening components (e.g., Re, Ta, Hf, Zr, Si, or a mixture thereof) within its composition. For example, the as-deposited MCrAlY layer (e.g., prior to Pt plating and Al deposition) may include about 5% to about 7% Ta and/or about 1% to about 3% Re, by weight. A thermal barrier coating is optionally positioned on the MCrAlY coating on its surface opposite of the component The coating system can reduce the susceptibility of gas turbine components to property degradation such as low-cycle fatigue failures, while retaining the benefits associated with protective coatings that are applied to the components. The present approach may be accomplished as part of the normal production operation, without major modifications. Additionally, the use of any additional bond coating or other layer between the surface of the component and the MCrAlY coating and/or within the construction of the MCrAlY coating (e.g., between the MCrAlY layer and the platinum-group metal aluminide coating) can be avoided in particular embodiments. That is, in this embodiment, the MCrAlY layer is directly on the surface of the component, and/or the platinum-group metal aluminide coating is directly on the MCrAlY layer to form the MCrAlY coating. When a thermal barrier coating is present, the coating system is free from a bond coating between the MCrAlY coating (e.g., the platinum-group metal aluminide coating of the MCrAlY coating) and the thermal barrier coating (e.g., the thermal barrier coating is directly on the platinum-group metal aluminide coating of the MCrAlY coating).

Figure 1A:
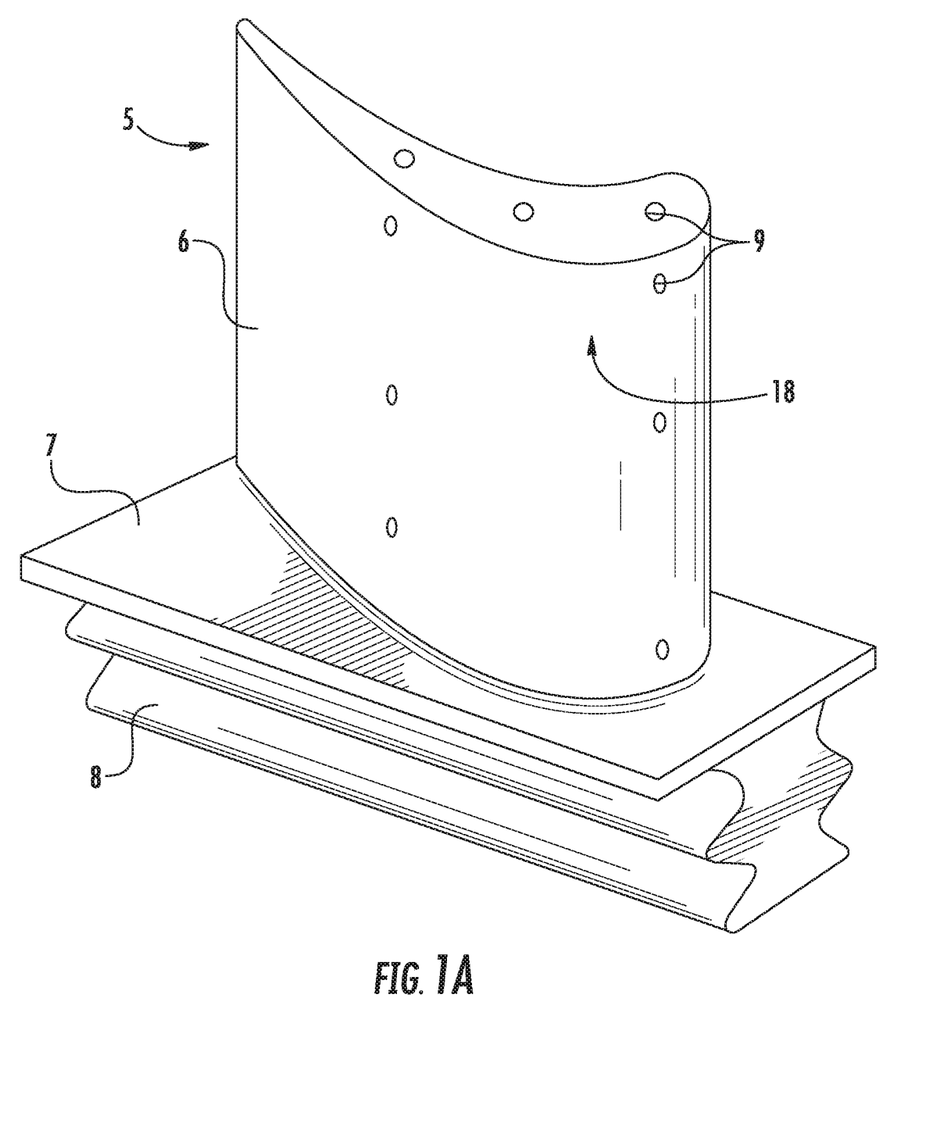
FIG. 1A is a perspective view of an component, such as a turbine blade of a gas turbine engine.

Referring to the drawings, FIG. 1A depicts an exemplary component 5 of a gas turbine engine, illustrated as a gas turbine blade. The turbine blade 5 includes an airfoil 6, a laterally extending platform 7, an attachment 8 in the form of a dovetail to attach the gas turbine blade 5 to a turbine disk (not shown). In some components, a number of cooling channels extend through the interior of the airfoil 6, ending in openings 9 in the surface of the airfoil 6. The openings 9 may be, in particular embodiments, film holes.

Figure 1B:
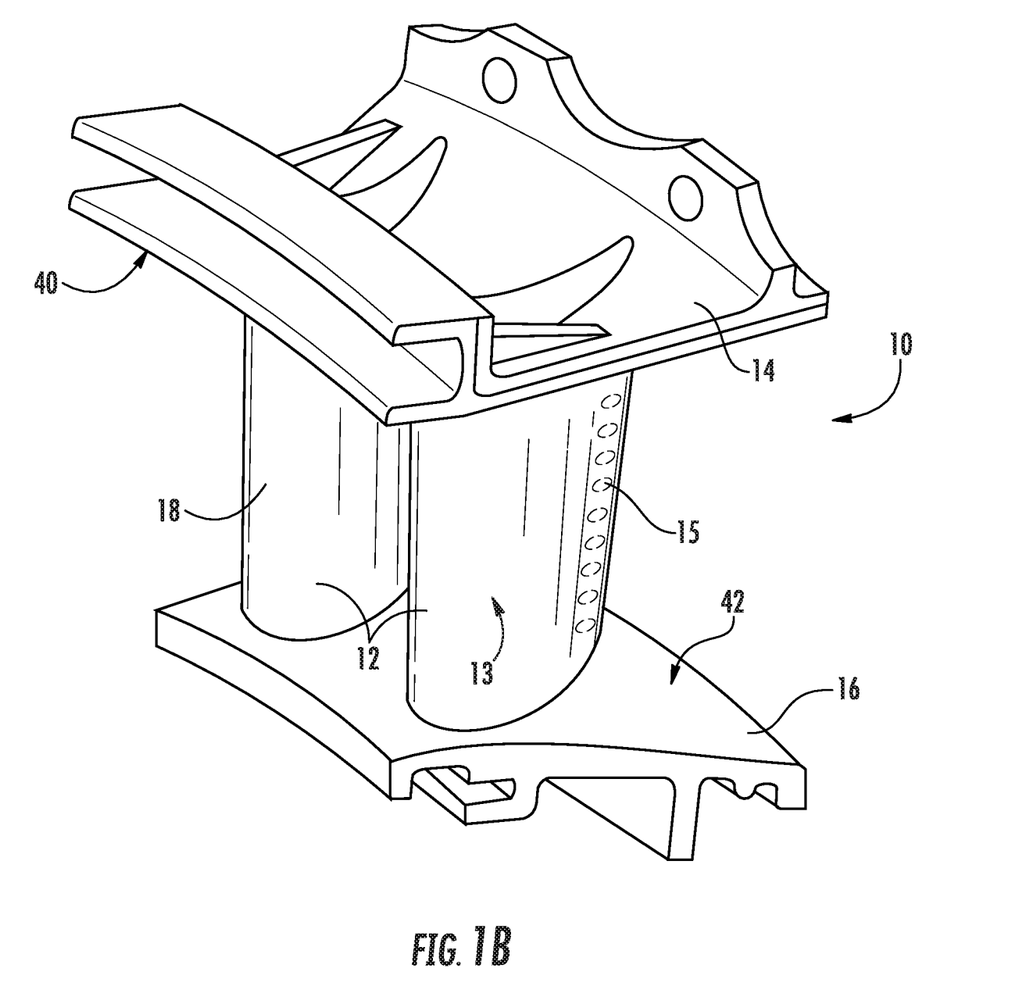
FIG. 1B is a perspective view of another component, such as a nozzle segment of a gas turbine engine.

FIG. 1B represents a nozzle segment 10 that is one of a number of nozzle segments that when connected together form an annular-shaped nozzle assembly of a gas turbine engine. The segment 10 is made up of multiple vanes 12, each defining an airfoil and extending between outer and inner platforms (bands) 14 and 16. The vanes 12 and platforms 14 and 16 can be formed separately and then assembled, such as by brazing the ends of each vane 12 within openings defined in the platforms 14 and 16. Alternatively, the entire segment 10 can be formed as an integral casting. The vanes 12 generally have a leading edge 22, a trailing edge 24, a pressure side 26 (i.e., the concave side), and a suction side 28 (i.e., the convex side). The leading edge 22 is at times described as being defined by the most forward point (nose) of the airfoil 12.

When the nozzle segment 10 is assembled with other nozzle segments to form a nozzle assembly, the respective inner and outer platforms of the segments form continuous inner and outer bands between which the vanes 12 are circumferentially spaced and radially extend. Construction of a nozzle assembly with individual nozzle segments is often expedient due to the complexities of the cooling schemes typically employed. The nozzle segment 10 depicted in FIG. 1B is termed a doublet because two vanes 12 are associated with each segment 10. Nozzle segments can be equipped with more than two vanes, e.g., three vanes (termed a triplet), four vanes, six vanes, or with a single vane to form what is termed a singlet. As known in the art, the design choice between singlet and doublet castings takes into consideration the advantages associated with their different constructions and processing. A significant advantage of singlet nozzle construction is the capability for excellent coating thickness distribution around the vanes 12, which in addition to promoting oxidation and corrosion resistance also promotes control of the throat area between nozzles and uniformity between vanes of different stages. On the other hand, a doublet casting avoids the necessity for a high temperature braze operation, though with less control of coating thickness.

In one embodiment, the airfoil 6 of the turbine blade 5 of FIG. 1A and the vanes 12 of the nozzle segment 10 of FIG. 1B are located in the turbine section of the engine and are subjected to the hot combustion gases from the engine's combustor. In addition to forced air cooling techniques (e.g., via film holes 15), the surfaces of these components are protected by a coating system 18 on their respective surfaces.

The airfoil 6 of the turbine blade 5 of FIG. 1A and the vanes 12 of the nozzle segment 10 of FIG. 1B can be formed of a material that can be formed to the desired shape and withstand the necessary operating loads at the intended operating temperatures of the area of the gas turbine in which the segment will be installed. Examples of such materials include metal alloys that include, but are not limited to, titanium-, aluminum-, cobalt-, nickel-, and steel-based alloys. In one particular embodiment, the airfoil 6 of FIG. 1A and/or the vanes 12 of FIG. 1B are formed from a superalloy metal material, such as a nickel-based superalloy, a cobalt-based superalloy, or an iron-based superalloy. In typical embodiments, the superalloy component has a 2-phase structure of fine γ-(M) (face-center cubic) and β-(M)Al (body-center cubic). The β-(M)Al phase is the aluminum (Al) reservoir. Aluminum near the surface may be depleted during service by diffusion to the TBC interface forming $\alpha$-$Al_2O_3$ thermally grown oxide on the surface of the diffusion coated substrate.

Although described above and in FIGS. 1A and 1B with respect to the turbine blade 5 and the nozzle segment 10, the coating system can be utilized with any component of the gas turbine engine.

Figure 2:
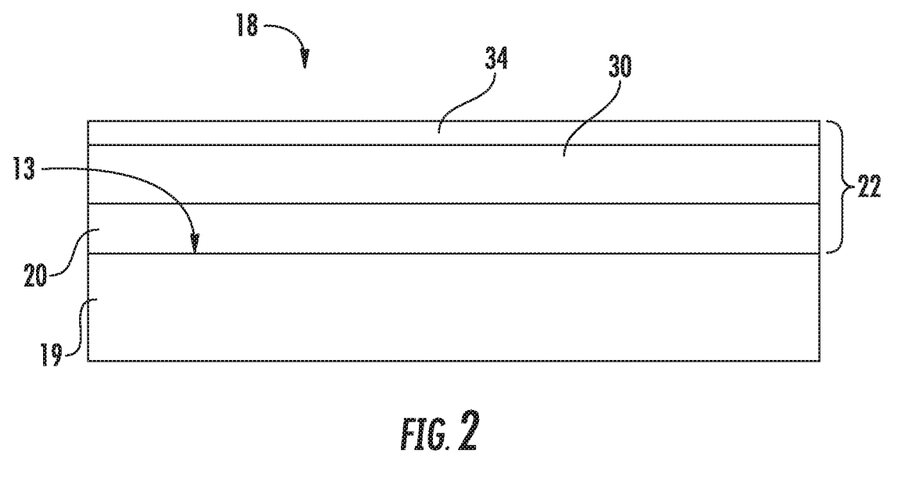
FIG. 2 is a cross-sectional view of an exemplary MCrAlY coating on a surface of a component, such as the airfoil of FIG. 1A or FIG. 1B, prior to heat treatment.

Referring to FIG. 2, the coating system 18 is shown including a MCrAlY coating 22 prior to heat treatment, which shows the MCrAlY coating 22 formed from a MCrAlY layer 20 on the surface of the superalloy component 19 (e.g., an airfoil 12), a platinum-group metal layer 30, and an aluminide coating 34.

The MCrAlY layer 20 is deposited with a composition, prior to forming the platinum-group metal layer, has a composition comprising, by weight, up to about 25% Cr (e.g., about 10% to about 25% Cr), about 6 to about 7% Al, up to about 1% Hf (e.g., about 0.1% to about 1% Hf), up to about 0.5% Y (e.g., about 0.1% to about 0.5% Y), about 8 to about 12% Co, about 5 to about 7% Ta, about 1 to about 3% Re, about 0.5 to about 1.5% Si, up to about 0.5% Zr (e.g., about 0.0001% to about 0.5% Zr), and the balance Ni. The MCrAlY layer 20 is formed to a thickness on the surface 13 of about 10 μm to about 100 μm (e.g., about 15 μm to about 50 μm). By keeping the MCrAlY layer 20 relatively thin (i.e., less than 100 µm), any film holes defined within the surface can remain open even without the use of mask or other deposition blocking method.

The MCrAlY layer 20 is formed on the surface of the component thereby according to any suitable application process. Non-limiting examples include plasma deposition (for example, ion plasma deposition, vacuum plasma spraying (VPS), low pressure plasma spray (LPPS), and plasma-enhanced chemical-vapor deposition (PECVD)), high velocity oxygen fuel (HVOF) techniques, high-velocity air-fuel (HVAF) techniques, physical vapor deposition (PVD), electron beam physical vapor deposition (EBPVD), chemical vapor deposition (CVD), air plasma spray (APS), cold spraying, and laser ablation. In one embodiment, the MCrAlY layer 20 is applied by a thermal spray technique (for example, VPS, LPPS, HVOF, HVAF, APS, and/or cold-spraying). In one particular embodiment, the MCrAlY layer 20 is formed via ion plasma deposition.

A platinum-group metal layer 30 is deposited on the MCrAlY layer 20. The platinum-group metal layer 30 generally includes platinum, rhodium, palladium, ruthenium, osmium, iridium, or a mixture thereof. These elements have similar physical and chemical properties and tend to occur together in the same mineral deposits. In one embodiment, the palladium-group platinum-group metals (i.e., platinum, rhodium, palladium, or a mixture thereof) are included in the platinum-group metal layer 30. In one particular embodiment, the platinum-group metal layer 30 generally includes platinum, but may also include other elements (e.g., palladium and/or rhodium). For example, the platinum-group metal layer 30 can include a platinum-palladium alloy, a platinum-rhodium alloy, or a platinum-palladium-rhodium alloy. In one embodiment, platinum-group metal layer 30 includes platinum in at least 50% by weight (e.g., about 75% to 100% by weight).

In most embodiments, a suitable thickness for a platinum-group metal layer 30 is about 1 µm to about 10 µm (e.g., about 3 µm to about 7 µm). In the embodiment shown, the platinum-group metal layer 30 is formed directly on the surface 13 due to this relatively thin nature of the platinum-group metal layer. As such, no other layer (e.g., a bond coating) is positioned between the surface 13 and the platinum-group metal layer 30.

The platinum-group metal layer 30 can be formed via any suitable process. For example, the platinum-group metal layer 30 is, in one particular embodiment, deposited by an electrodeposition process as (e.g., electroplating), although sputtering, brush plating, etc. could alternatively be used. Plating can be performed at room temperature (e.g., about 20° C. to about 25° C.). In one embodiment, the electrodeposition process is accomplished by placing a platinum-group metal-containing solution (e.g., platinum-containing solution) into a deposition tank and depositing platinum-group metal from the solution onto the surface 13. For example, when depositing platinum, the platinum-containing aqueous solution can include $Pt(NH_3)_4HPO_4$, and the voltage/current source can be operated at about ½-10 amperes per square foot of facing article surface. In the deposition, the platinum-group metal layer 30 is deposited onto the unmasked portion of the surface 13 (i.e., the trailing edge 24).

The platinum-group metal layer 30 may be heat treated, as desired. For example, the platinum-group metal layer 30 can be heat treated at a treatment temperature of about 900° C. to about 1200° C. In one embodiment, the platinum-group metal layer 30 is heat treated in a vacuum (e.g., at a treatment pressure of about 10 torr or less, such as at a treatment pressure of about 1 torr or less).

An oxidation-resistant coating is applied to the surface 13 of the airfoil 12 to further promote the oxidation resistance. In one particular embodiment, the oxidation-resistant coating is a diffusion aluminide coating 34, which may include aluminum intermetallics, gamma phase, gamma prime phase, or the like. The aluminide coating 34 is deposited overlying the platinum-group metal layer 30. The aluminide coating 34 can be formed to a thickness of about 2 µm to about 100 µm (e.g., about 25 µm to about 100 µm, such as about 35 µm to about 75 µm) by any suitable method. For example, the aluminide coating 34 can be deposited by any operable approach, such as aluminiding by pack cementation, or other processes including vapor phase aluminiding.

In one embodiment, the aluminide coating 34 is deposited via vapor phase aluminiding. For example, a hydrogen halide gas, such as hydrogen chloride or hydrogen fluoride, is contacted with aluminum metal or an aluminum alloy to form the corresponding aluminum halide gas. Other elements may be doped into the aluminum layer from a corresponding gas, if desired. The aluminum halide gas contacts the surface 13, depositing the aluminum thereon. The deposition occurs at elevated temperature such as from about 900° C. to about 1125° C. during a cycle time (e.g., a 4 to 20 hour cycle). The aluminide coating 34 is preferably from about 12 to about 125 micrometers thick (such as about 25 µm to about 100 µm, for example about 35 µm to about 75 µm). The deposition technique allows alloying elements to be co-deposited into the aluminide coating 34 if desired, from the halide gas.

Because the deposition of aluminum is performed at elevated temperature, the deposited aluminum atoms inter-diffuse with the platinum-group metal layer 30 (or interdiffused platinum/substrate region) and/or the material of the surface 13 forming a diffusion zone.

In the embodiment shown in FIG. 2, the aluminide coating 34 is deposited on the entire surface 13, within any cavities and any film holes present in the surface 13, and over the platinum-group metal layer 30. During processing, the aluminide coating reacts with the platinum-group metal layer 30 to form a platinum-group metal aluminide coating 31. This platinum-group metal aluminide coating 31 comprises the platinum-group metal and aluminum, such as platinum-modified aluminides (PtAl), but may contain additional components (e.g., platinum-modified nickel aluminides. Thus, the platinum-group metal plating, followed by diffusion aluminide, results in a "platinum aluminide layer" where its outer layer of the coating has the platinum-group metal (e.g., platinum), in addition to diffusion aluminide.

Figure 3:
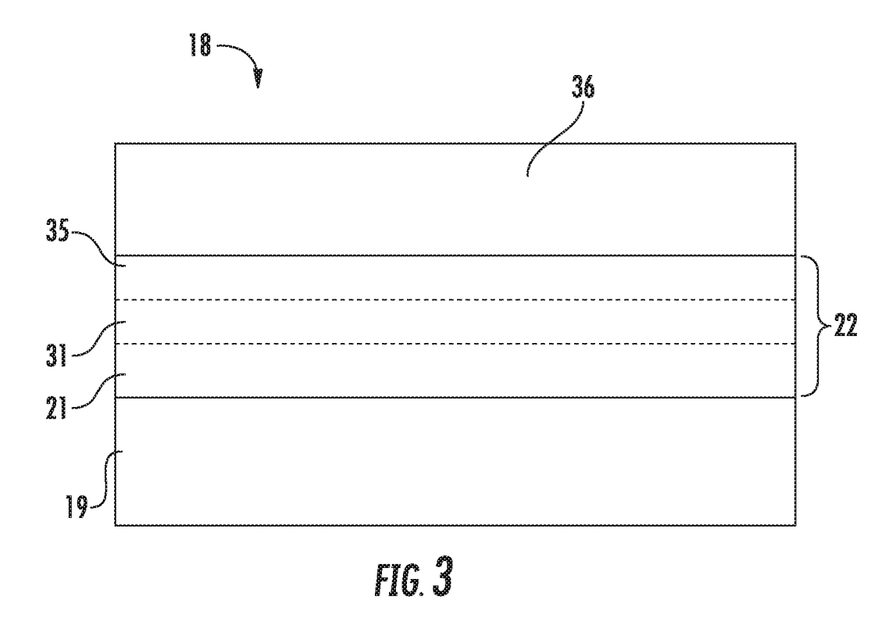
FIG. 3 is a cross-sectional view of an exemplary coating system including the MCrAlY coating after heat treatment and forming a TBC.
Figure 4:
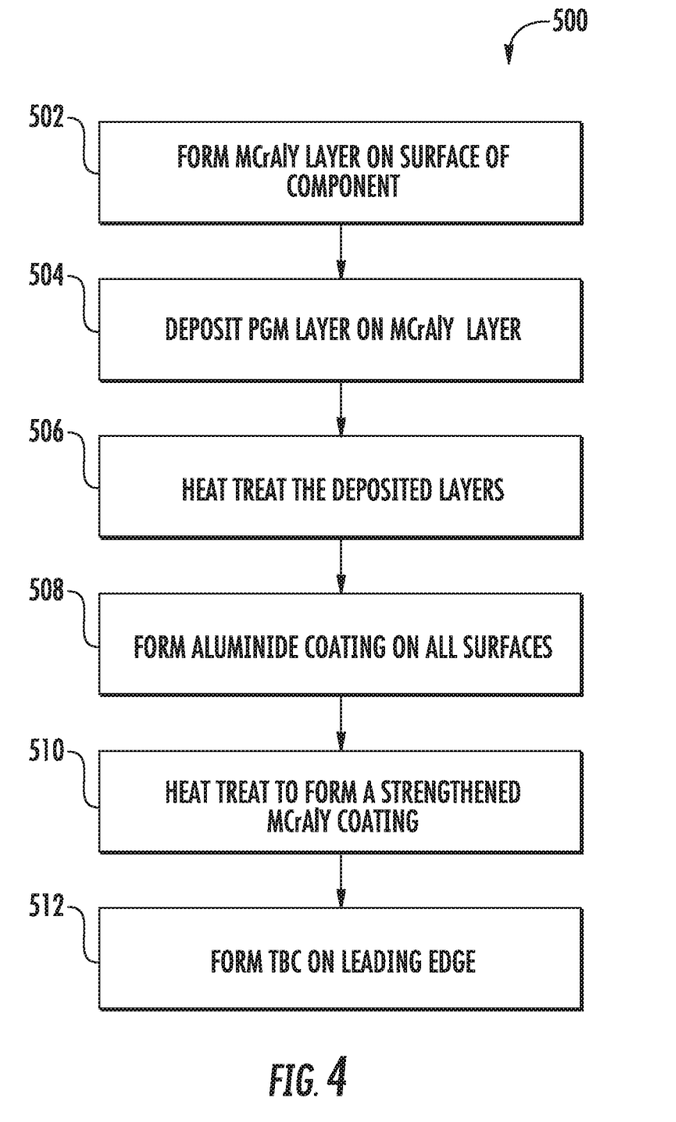
FIG. 4 is a block diagram of an exemplary method of forming a coating on a surface of an airfoil.

Following heat treatment of the MCrAlY layer 20, the platinum-group metal layer 30, and the aluminide coating 34 shown in FIG. 2, a MCrAlY coating 22 is formed to have a compositional gradient throughout its thickness, as defined by an inner portion 21, a middle portion 31, and an outer portion 35, as shown in FIG. 3. In one embodiment, heat treatment is performed in vacuum at a treatment temperature of about 975° C. to about 1125° C. (e.g., for a treatment period of about 1 to about 4 hours).

Generally, the resulting heat treated MCrAlY coating 22 has a compositional gradient throughout its thickness, and includes an inner portion 21, a middle portion 31, and an outer portion 35. The inner portion 21 is generally adjacent to the component, while the outer portion 35 is opposite from the component and adjacent to the TBC 36. Each of the inner portion 21, the middle portion 31, and the outer portion

35 define a third (i.e., ⅓) of the thickness of the MCrAlY coating 22. For example, if the MCrAlY coating 22 has a thickness of about 60 μm to about 100 μm (e.g., about 75 μm to about 85 μm) then the inner portion 21, the middle portion 31, and the outer portion 35 each define a thickness of about 20 μm to about 33.3 μm (e.g., about 25 μm to about 28.3 μm).

The MCrAlY coating 22, in one embodiment, has a compositional gradient with the outer portion 35 having a relatively low concentration of Cr and relatively high concentrations of Pt and Al, when compared to the composition of the middle portion 31. As such, outer portion 35 has good oxidation qualities and adherence to TBC (or other layers thereon). However, an increased concentration of Cr in the middle portion 31 and/or the inner portion 21 can allow for increased corrosion resistance, which is particularly useful in marine and industrial engine applications.

In one particular embodiment, the inner portion 21 has a chromium (Cr) content that is lower, in terms of weight percent, than the chromium content of the middle portion 31. Similarly, the outer portion 35 has a chromium content that is lower, in terms of weight percent, than the chromium content of the middle portion 31. As such, the middle portion 31 has a chromium content that this greater than, in terms of weight percent, than the inner portion 21 and/or the outer portion 35. In certain embodiments, for example, the outer portion 35 has a chromium content of about 3% to about 7.5% by weight; the middle portion 31 has a chromium content of about 8% to about 20% by weight; and the inner portion 21 has a chromium content of about 5% to about 12% by weight.

In one particular embodiment, the outer portion 35 has a rhenium (Re) content that is less than, in terms of weight percent, than the rhenium content of the middle portion 31. Similarly, middle portion 31 has a rhenium content that is less than, in terms of weight percent, than the rhenium content of the inner portion 21. In certain embodiments, for example, the outer portion 35 has a rhenium content of 0% to about 0.1% by weight; the middle portion 31 has a rhenium content of about 0.1% to about 4% by weight; and the inner portion 21 has a rhenium content of greater than about 3% by weight.

In one particular embodiment, the outer portion 35 has a tantalum (Ta) content that is lower, in terms of weight percent, than the tantalum content of the middle portion 31. In certain embodiments, for example, the outer portion 35 has a tantalum content of about 0.1% to about 2.25% by weight; the middle portion 31 has a tantalum content of about 2.5% to about 7.5% by weight. In such embodiments, the inner portion 21 can have a tantalum content of about 3% to about 7.5% by weight.

In one particular embodiment, the outer portion 35 has a tungsten (W) content that is lower, in terms of weight percent, than the tungsten content of the middle portion 31. In certain embodiments, for example, the outer portion 35 has a tungsten content of 0% to about 0.015% by weight; the middle portion 31 has a tungsten content of about 0.1% to about 1% by weight; and the inner portion 21 has a tungsten content of about 1.5% to about 6%.

Similarly, in one particular embodiment, the inner portion 21 has a hafnium (Hf) content that is lower, in terms of weight percent, than the hafnium content of the middle portion 31. Similarly, the outer portion 35 has a hafnium content that is lower, in terms of weight percent, than the hafnium content of the middle portion 31. As such, the middle portion 31 has a hafnium content that this greater than, in terms of weight percent, than the inner portion 21 and/or the outer portion 35. In certain embodiments, for example, the outer portion 35 has a hafnium content of 0% to about 0.1% by weight; the middle portion 31 has a hafnium content of about 0.1% to about 0.5% by weight; and the inner portion 21 has a hafnium content of 0% to about 0.1% by weight.

In one particular embodiment, the outer portion 35 has a nickel (Ni) content that is higher, in terms of weight percent, than the nickel content of the middle portion 31. Similarly, the inner portion 21 has a nickel content that is higher, in terms of weight percent, than the nickel content of the middle portion 31. As such, the middle portion 31 has a nickel content that this less than, in terms of weight percent, than the inner portion 21 and/or the outer portion 35. In certain embodiments, for example, the outer portion 35 has a nickel content of about 40% to about 50% by weight; the middle portion 31 has a nickel content of about 30% to about 40% by weight; and the inner portion 21 has a nickel content of greater than about 40% (e.g., greater than about 50%) by weight.

The MCrAlY coating 22 is deposited and processed to have a smooth surface finish, e.g., about 3 μm or less of surface roughness (Ra), in order to promote the aerodynamics of the nozzle assembly. In one embodiment, the MCrAlY coating 22 preferably has a surface roughness (Ra) of less than about 3 μm (e.g., about 0.75 μm to about 2.75 μm, such as about 1.25 μm to about 2.25 μm).

FIG. 3 also shows an environmental coating 36 (e.g., a thermal barrier coating (TBC)) over the MCrAlY coating 22, which is particularly useful if further protection is required (e.g., on the surface of an airfoil 12 to be used at very high temperatures). In particular embodiments, the environmental coating 36 may also be deposited on the surfaces of the inner bands and outer bands. For example, the thermal barrier coating 36 may be entirely composed of one or more ceramic compositions. The environmental coating 36 may be applied by any operable technique, with electron beam physical vapor deposition (EB-PVD) being preferred for the preferred yttria-stabilized zirconia coating. The EB-PVD processing may be preceded and/or followed by high-temperature processes that may affect the distribution of elements in the bond coat. The EB-PVD process itself is typically conducted at elevated temperatures. Other coatings, coating compositions, and coating thicknesses are also within the scope of the invention.

The thermal barrier coating 36 is deposited and processed to have a very smooth surface finish, e.g., about 1.5 μm Ra or less, in order to promote the aerodynamics of the nozzle assembly. In one embodiment, the thermal barrier coating 36 preferably has an as-deposited surface roughness (Ra) of less than about 3 μm. Thereafter, the surface of the environmental coating 36 preferably undergoes processing, preferably peening and then tumbling, to improve the surface finish of the environmental coating 36. Following peening and tumbling, the environmental coating 36 preferably has a surface roughness of not higher than about 2.0 μm Ra, with a typical range being about 1.3 μm to about 1.8 μm Ra on the concave surfaces and leading edges of the vanes, and about 0.5 μm to 1.0 μm Ra on the convex surfaces of the vanes.

In the embodiments shown in FIGS. 2 and 3, the coating system is substantially free from any bond coating. That is, the coating system is free from a bond coating between the MCrAlY coating 22 and the surface 13 of the superalloy component 19, and the coating system 18 is free from a bond coating between the MCrAlY coating 22 and the thermal barrier coating 36. For example, the MCrAlY coating 22 may be directly on the surface 13 of the component 19, and/or the thermal barrier coating 36 may be directly on the MCrAlY coating 22.

As stated, the nozzle segment can have any number of airfoils (e.g., one (a singlet), two (a doublet), four, six, etc.). Different processing methods can be utilized, depending on the number of airfoils in the nozzle segments. In most embodiment, the film holes can be formed (e.g., drilled) prior to any coating is formed, and may be masked for any subsequent coatings to be applied if desired.

The present invention is generally applicable to components that operate within environments characterized by relatively high temperatures, and particularly to nozzle segments of the type represented in FIG. 1B and therefore subjected to severe oxidizing and corrosive operating environments. It should be noted that the drawings are drawn for purposes of clarity when viewed in combination with the following description, and therefore are not intended to be to scale.

Figure 5:
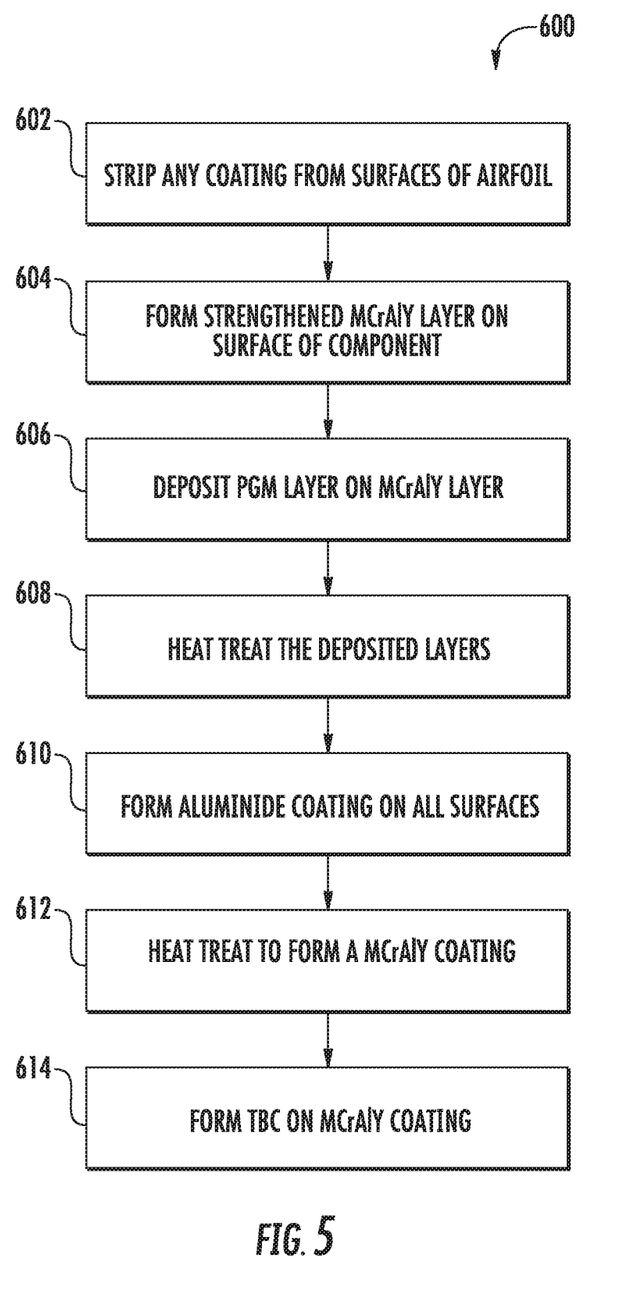
FIG. 5 is a block diagram of an exemplary method of repairing a coating on a surface of an airfoil.

Methods are also generally provided for forming a coating on a surface of component (e.g., an airfoil) and for repairing a coating on the surface of an airfoil. Referring to FIG. 5, a diagram of an exemplary method 500 is generally shown for forming a coating on a surface of a component. At 502, a MCrAlY layer is deposited on the surface of a component. At 504, a platinum-group metal (PGM) layer is deposited on the MCrAlY layer, such as an electroplating process described above. The PGM layer is heat treated at 506, such as via heating to a treatment temperature of about 900° C. to about 1200° C. An aluminide coating can be formed on all the surfaces at 508, such as the vapor deposition. At 510, the deposited layers can be heat treated to form a MCrAlY coating. At 512, a thermal barrier coating (TBC) can be formed over the MCrAlY coating, such as through a plasma spray deposition process.

Referring to FIG. 6, a diagram of an exemplary method 600 is generally shown for repairing a coating on a surface of a component (e.g., an airfoil). At 601, any and all coatings can be stripped from the services of the airfoil, such as the chemical stripping process (e.g., acid stripping, etc.). At 602, a MCrAlY layer is deposited on the surface of a component. At 604, a platinum-group metal (PGM) layer is deposited on the MCrAlY layer, such as an electroplating process described above. The PGM layer is heat treated at 606, such as via heating to a treatment temperature of about 900° C. to about 1200° C. An aluminide coating can be formed on all the surfaces at 608, such as the vapor deposition. At 610, the deposited layers can be heat treated to form a MCrAlY coating. At 612, a thermal barrier coating (TBC) can be formed over the MCrAlY coating, such as through a plasma spray deposition process. Through such a repair process, the coating can be improved through the inclusion of the platinum-group metal.

These and other modifications and variations to the present invention may be practiced by those of ordinary skill in the art, without departing from the spirit and scope of the present invention, which is more particularly set forth in the appended claims. In addition, it should be understood the aspects of the various embodiments may be interchanged both in whole or in part. Furthermore, those of ordinary skill in the art will appreciate that the foregoing description is by way of example only, and is not intended to limit the invention so further described in the appended claims.

What is claimed is:

1. A method of forming a MCrAlY coating on a surface of a superalloy component, wherein M is Ni, Fe, Co, or a combination thereof, the method comprising:

forming a MCrAlY layer on the surface of the superalloy component, wherein the MCrAlY layer has a first chromium content and the superalloy has a second chromium content, wherein the first chromium content is higher than the second chromium content;

forming a platinum-group metal layer on the MCrAlY layer;

thereafter, heating the platinum-group metal layer to a treatment temperature of about 900° C. to about 1200° C.;

forming an aluminide coating over the platinum-group metal layer; and after forming the aluminide coating over the platinum-group metal layer, heating the MCrAlY layer, the platinum-group metal layer, and the aluminide coating to form the MCrAlY coating such that the MCrAlY coating includes an inner portion adjacent to the superalloy component, a middle portion on the inner portion, and an outer portion on the middle portion, and wherein the middle portion has a chromium middle portion content that is greater than, in terms of weight percent, than the inner portion and the outer portion;

wherein the outer portion has a chromium outer portion content of about 3% to about 7.5% by weight, and wherein the chromium middle portion content is about 8% to about 20% by weight, and further wherein the inner portion has a chromium inner portion content of about 5% to about 12% by weight.

2. The method as in claim 1, wherein the surface of the superalloy component defines a plurality of holes therein, and wherein the MCrAlY coating is formed to a thickness of about 10 μm to about 100 μm while keeping open the holes defined within the surface of the superalloy component.

3. The method as in claim 1, wherein the MCrAlY layer, prior to forming the platinum-group metal layer, has a composition comprising, by weight, about 10% to about 25% Cr, about 6 to about 7% Al, about 0.1% to about 1% Hf, about 0.1% to about 0.5% Y, about 8% to about 12% Co, about 5% to about 7% Ta, about 1% to about 3% Re, about 0.5 to about 1.5% Si, about 0.0001% to about 0.5% Zr, and the balance Ni.

4. The method as in claim 1, wherein the aluminide coating is deposited to a thickness of about 25 μm to about 100 μm.

5. The method as in claim 1, further comprising:
after forming the aluminide coating, forming a thermal barrier coating over the aluminide coating.

6. The method as in claim 1, wherein the outer portion has a rhenium outer portion content that is less than, in terms of weight percent, a rhenium middle portion content of the middle portion, and further wherein the rhenium middle portion content that is less than, in terms of weight percent, a rhenium inner portion content of the inner portion, and wherein the rhenium outer portion content is 0% to about 0.1% by weight, and wherein the rhenium middle portion content is about 0.1% to about 4% by weight, and wherein the rhenium inner portion content is greater than about 3% by weight.

7. The method as in claim 1, wherein the outer portion has a tantalum outer portion content that is lower, in terms of weight percent, than a tantalum middle portion content of the middle portion, wherein the tantalum outer portion content is about 0.1% to about 2.25% by weight, and wherein the tantalum middle portion content is about 2.5% to about 7.5% by weight.

8. The method as in claim 1, wherein the MCrAlY coating defines an external surface having a surface roughness (Ra) of about 0.75 μm to about 2.75 μm.

9. The method as in claim 1, wherein the MCrAlY coating is directly on the surface of the superalloy component.

10. The method of claim 1, wherein the platinum-group metal layer is heated to the treatment temperature at a treatment pressure of 10 torr or less.

11. The method of claim 1, wherein each of the inner portion, the middle portion, and the outer portion define equal parts of a thickness of the MCrAlY coating.

* * * * *